United States Patent
Zhang et al.

(10) Patent No.: US 9,236,435 B2
(45) Date of Patent: Jan. 12, 2016

(54) TUNNELING FIELD EFFECT TRANSISTOR

(71) Applicant: Samsung Electronics Co., Ltd., Suwon-si (KR)

(72) Inventors: Xin-Gui Zhang, Suwon-si (KR); Tae-Yong Kwon, Suwon-si (KR); Sang-Su Kim, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/563,155

(22) Filed: Dec. 8, 2014

(65) Prior Publication Data

US 2015/0200288 A1     Jul. 16, 2015

(30) Foreign Application Priority Data

Jan. 16, 2014 (KR) .................. 10-2014-0005601

(51) Int. Cl.
| | | |
|---|---|---|
| *H01L 29/78* | (2006.01) | |
| *H01L 29/205* | (2006.01) | |
| *H01L 29/165* | (2006.01) | |
| *H01L 29/73* | (2006.01) | |
| *H01L 29/737* | (2006.01) | |
| *H01L 29/739* | (2006.01) | |

(52) U.S. Cl.
CPC ............ *H01L 29/205* (2013.01); *H01L 29/165* (2013.01); *H01L 29/737* (2013.01); *H01L 29/7311* (2013.01); *H01L 29/7376* (2013.01); *H01L 29/7391* (2013.01); *H01L 29/7848* (2013.01)

(58) Field of Classification Search
CPC ............... H01L 29/66431; H01L 29/664262; H01L 29/66522; H01L 29/205; H01L 29/4908; H01L 29/78; H01L 29/7311; H01L 29/737; H01L 29/7376

USPC ............................................. 257/192
See application file for complete search history.

(56) References Cited

U.S. PATENT DOCUMENTS

| 8,026,509 B2 | 9/2011 | Goel et al. |
| 8,384,122 B1 | 2/2013 | Hu et al. |
| 2009/0026553 A1* | 1/2009 | Bhuwalka ......... H01L 29/66356 257/402 |
| 2010/0200916 A1* | 8/2010 | Gossner ............... H01L 29/083 257/335 |
| 2011/0042757 A1 | 2/2011 | Tan et al. |

(Continued)

FOREIGN PATENT DOCUMENTS

JP     2013-105838 A    5/2013

OTHER PUBLICATIONS

Uygar E. Avci, et al. / Comparison of Performance, Switching Energy and Process Variations for the TFET and MOSFET in Logic / 2011 Symposium on VLSI Technology Digest of Technical Papers / 2 Pages.

(Continued)

*Primary Examiner* — Minh-Loan Tran
(74) *Attorney, Agent, or Firm* — Muir Patent Law, PLLC

(57) ABSTRACT

Tunneling field effect transistors are provided. The tunneling field effect transistor includes a source region, a drain region, and a channel region disposed between the source region and the drain region. The channel region includes a first region adjacent to the source region and a second region adjacent to the drain region. A first energy band gap of the first region is lower than a second energy band gap of the second region, and the first region has a direct energy band gap.

18 Claims, 17 Drawing Sheets

(56) References Cited

U.S. PATENT DOCUMENTS

| | | | |
|---|---|---|---|
| 2011/0049474 A1 | 3/2011 | Bjoerk et al. | |
| 2011/0084319 A1 | 4/2011 | Zhu et al. | |
| 2011/0253981 A1 | 10/2011 | Rooyackers et al. | |
| 2012/0223387 A1* | 9/2012 | Cui et al. | 257/366 |
| 2013/0075830 A1 | 3/2013 | Miyano et al. | |
| 2013/0093497 A1 | 4/2013 | Lee et al. | |
| 2013/0119395 A1 | 5/2013 | Bhuwalka et al. | |
| 2013/0161696 A1 | 6/2013 | Verhulst et al. | |

OTHER PUBLICATIONS

Tejas Krishnamohan, et al. / Double-Gate Strained-Ge Heterostructure Tunneling FET (TFET) With Record High Drive Currents and <60mV/dec Subthreshold Slope / IEDM 2008 / 3 Pages.

G. Dewey, et al. / III-V Field Effect Transistors for Future Ultra-Low Power Applications / 2012 Symposium on VLSI Technology Digest of Technical Papers / 2 Pages.

Yue Yang, et al. / Germanium-tin n- channel tunnel field-effect transistor: Device physics and simulation study / Journal of Applied Physics 113, 194507 (2013) / 8 Pages.

Chun-Hsing Shih, et al. / Physical operation and device design of short-channel tunnel field-effect transistors with graded silicon-germanium heterojunctions / Journal of Applied Physics 113, 134507 (2013) / 8 Pages.

G. Dewey, et al. / Fabrication, Characterization and Physics of III-V Heterojunction Tunneling Field Effect Transistors (H-TFET) for Steep Sub-Threshold swing / IEDM 2011 / 4 Pages.

Woo Young Choi, et al. / Tunneling Field-Effect Transistors (TFETSs) With Subthreshold Swing (SS) Less Than 60 mV/dec / IEEE Electron Device Letters, Vol. 28, No. 8, Aug. 2007 / 3 Pages.

* cited by examiner

TUNNELING FIELD EFFECT TRANSISTOR

CROSS-REFERENCE TO RELATED APPLICATION

This U.S. non-provisional patent application claims priority under 35 U.S.C. §119 to Korean Patent Application No. 10-2014-0005601, filed on Jan. 16, 2014, in the Korean Intellectual Property Office, the disclosure of which is hereby incorporated by reference in its entirety.

BACKGROUND

The inventive concepts relate to semiconductor devices and, more particularly, to tunneling field effect transistors.

Semiconductor devices are widely used in the electronics industry because of their small size, multi-function, and/or low manufacture costs. Semiconductor devices may be categorized as any one of semiconductor memory devices storing logical data, semiconductor logic devices processing logical data, and hybrid semiconductor devices having both the function of the semiconductor memory devices and the function of the semiconductor logic devices. Semiconductor devices having excellent characteristics have been increasingly demanded with the development of the electronics industry. For example, high-reliable, high-speed and/or multi-functional semiconductor devices have been increasingly demanded. To satisfy these demands, structures of semiconductor devices have been complicated and semiconductor devices have been highly integrated.

SUMMARY

Embodiments of the inventive concepts may provide tunneling field effect transistors having a high on-current and a low off-current.

In one aspect of the inventive concept, a tunneling field effect transistor may include: a source region including a first intrinsic material; a drain region including a second intrinsic material; and a channel region including a third intrinsic material, and disposed between the source region and the drain region. The channel region may include: a first region adjacent to the source region, and the second region adjacent to the drain region. A first energy band gap of the first region may be lower than a second energy band gap of the second region, and the first region may have a direct energy band gap.

In some embodiments, an energy band gap of the channel region may become progressively lower from the second region toward the first region.

In some embodiments, an energy band gap of the channel region may become lower stepwise from the second region toward the first region.

In some embodiments, each of the first, the second, and the third intrinsic materials may include group III-V semiconductor materials.

In some embodiments, the second region may have a direct energy band gap.

In some embodiments, the third intrinsic material may include at least one of indium-gallium-arsenic (InGaAs), indium-gallium-antimony (InGaSb), gallium-antimony (GaSb), indium-arsenic (InAs), or gallium-arsenic-antimony (GaAsSb).

In some embodiments, the third intrinsic material may include indium-gallium-arsenic (InGaAs), and a gallium (Ga) concentration of the channel region may become lower from the second region toward the first region.

In some embodiments, the third intrinsic material may include indium-gallium-antimony (InGaSb), and an indium (In) concentration of the channel region may become higher from the second region toward the first region.

In some embodiments, each of the first, the second, and the third intrinsic materials may include one or more group IV semiconductor materials.

In some embodiments, the second region may have an indirect energy band gap.

In some embodiments, the third intrinsic material may include at least one of germanium-tin (GeSn), silicon-germanium (SiGe), geranium (Ge), silicon (Si), or geranium-lead (GePb).

In some embodiments, the third intrinsic material may include germanium-tin (GeSn) or silicon-germanium-tin (SiGeSn), and a tin (Sn) concentration of the first region may be higher than a tin (Sn) concentration of the second region.

In some embodiments, the tin (Sn) concentration of the first region may be equal to or greater than about 11%.

In some embodiments, the source region, the drain region, and the channel region may be provided on a substrate, and the source region and the drain region may be spaced apart from each other in a direction substantially perpendicular to a top surface of the substrate.

In some embodiments, the tunneling field effect transistor may further include a gate dielectric layer and a gate electrode sequentially provided on a sidewall of the channel region.

In some embodiments, the tunneling field effect transistor may further include a device isolation layer disposed at both sides of the channel region when viewed from a plan view. The gate dielectric layer and the gate electrode may be in contact with a top surface of the device isolation layer.

In some embodiments, the gate dielectric layer may include a high-k dielectric material having a dielectric constant higher than that of a silicon oxide layer.

In some embodiments, the gate electrode may include a metal material.

In another aspect of the inventive concept, a tunneling field effect transistor may include: a drain region, a channel region including a first intrinsic material, and a source region. The drain region, the channel region, and the source region are sequentially stacked either vertically or horizontally on a substrate. An energy band gap of the channel region resulting from the first intrinsic material may become lower from the drain region toward the source region. A first portion of the channel region adjacent to the source region may have a direct energy band gap, and a second portion of the channel region adjacent to the drain region may have an indirect energy band gap.

In some embodiments, the first intrinsic material may include germanium-tin (GeSn), and a tin (Sn) concentration of the first portion may be higher than a tin (Sn) concentration of the second portion.

In some embodiments, the (Sn) concentration of the first portion may be equal to or greater than about 11%.

In some embodiments, the energy band gap of the channel region may become progressively lower from the drain region toward the source region.

In still another aspect of the inventive concept, a tunneling field effect transistor may include a drain region, a channel region, and a source region sequentially stacked on a substrate. The drain region, the channel region, and the source region may be sequentially stacked in a direction either perpendicular to a surface of the substrate, or parallel to the surface of the substrate. The channel region may include an intrinsic material that includes group III-V semiconductor materials. The concentration of at least one group III-V element from the intrinsic material may become higher from one end of the channel region to an opposite end of the channel region.

In some embodiments, the intrinsic material may include at least one of indium-gallium-arsenic (InGaAs), indium-gallium-antimony (InGaSb), gallium-antimony (GaSb), indium-arsenic (InAs), or gallium-arsenic-antimony (GaAsSb).

In some embodiments, the intrinsic material may include indium-gallium-arsenic (InGaAs), and a gallium (Ga) concentration of the channel region may become lower from a second portion adjacent to the drain region to a first portion adjacent to the source region.

In some embodiments, the intrinsic material may include indium-gallium-antimony (InGaSb), and an indium (In) concentration of the channel region may become higher from a second portion adjacent to the drain region to a first portion adjacent to the source region.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
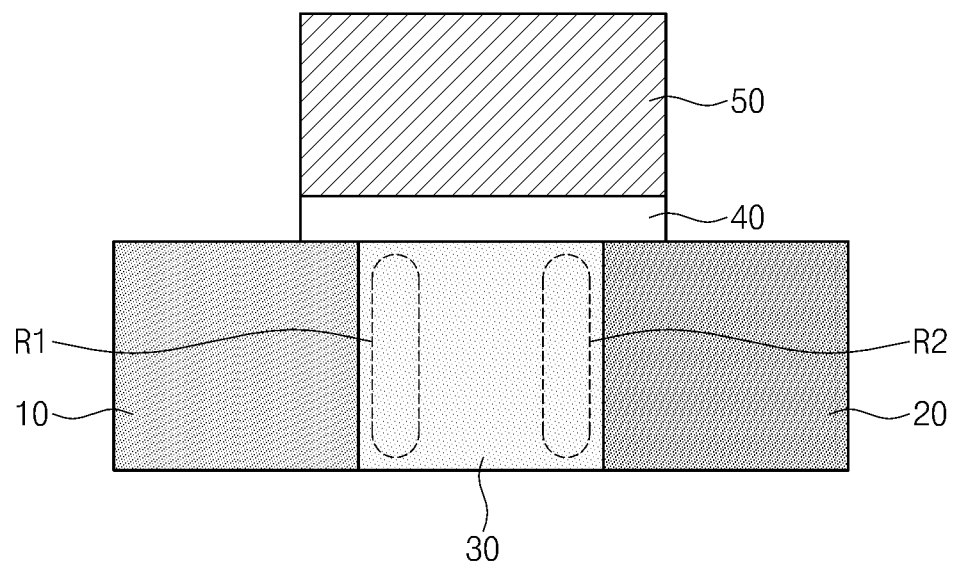
FIG. 1 is a conceptual diagram illustrating a tunneling field effect transistor according to some example embodiments of the inventive concepts.

The present disclosure will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. Expressions such as "at least one of," when preceding a list of elements, modify the entire list of elements and do not modify the individual elements of the list. As used herein, the term "and/or" includes any and all combinations of one or more of the associated listed items. It will be understood that when an element is referred to as being "connected" or "coupled" to another element, it may be directly connected or coupled to the other element or intervening elements may be present. The term "contact," as used herein, refers to a direct contact, unless indicated otherwise.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a conceptual diagram illustrating a tunneling field effect transistor according to some example embodiments of the inventive concepts.

Referring to FIG. 1, a tunneling field effect transistor according to some embodiments of the inventive concepts may include a source region 10, a drain region 20, and a channel region 30 between the source region 10 and the drain region 20. For example, the drain region, the channel region, and the source region may be sequentially stacked horizontally on a substrate. The terms "source region," "channel region," and "drain region," as used herein, refer to a "source," "channel," and "drain." For example, a source region 10 may function as a source, a channel region 30 may function as a channel, and a drain region 20 may function as a drain. A gate electrode 50 may be disposed on the channel region 30, and a gate dielectric layer 40 may be disposed between the gate electrode 50 and the channel region 30. The source region 10 and the drain region 20 may have different conductivity types from each other.

In some embodiments, if the tunneling field effect transistor is an N-type tunneling field effect transistor, the source region 10 may be a P-type dopant region and the drain region 20 may be an N-type dopant region. In other embodiments, if the tunneling field effect transistor is a P-type tunneling field effect transistor, the source region 10 may be an N-type dopant region and the drain region 20 may be a P-type dopant region. The channel region 30 may be an intrinsic region (e.g., including only the intrinsic material without any dopant). Alternatively, the channel region 30 may be a P-type or N-type dopant region (e.g., including an intrinsic material and dopant) that is more lightly doped than the source region 10 and the drain region 20.

Figure 11A:
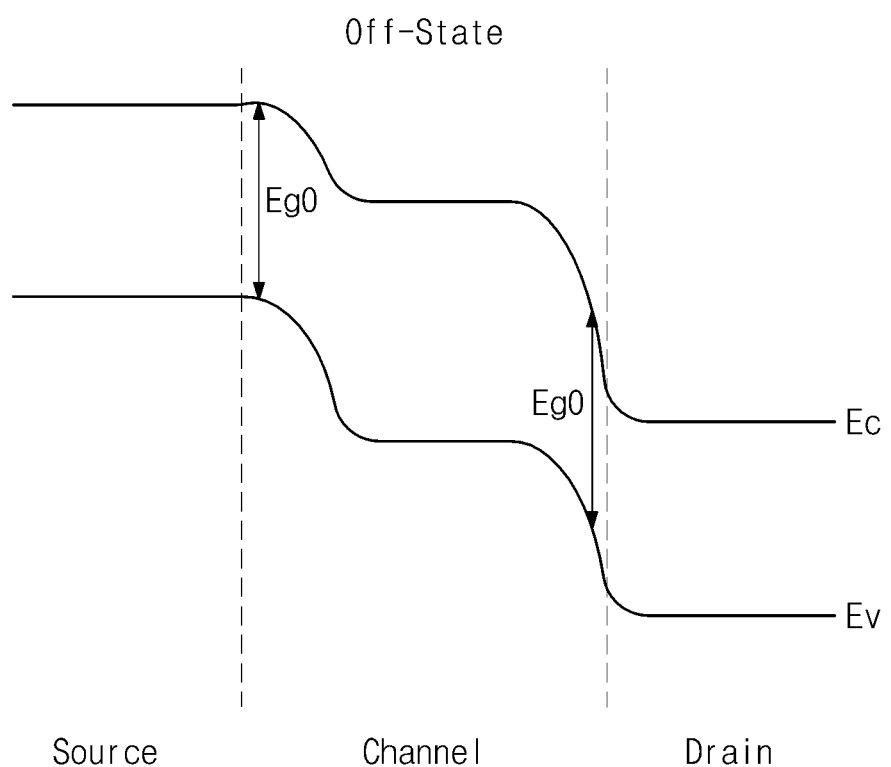
FIGS. 11A, 11B, and 11C are energy band diagrams of a general N-channel tunneling field effect transistor.
Figure 11B:
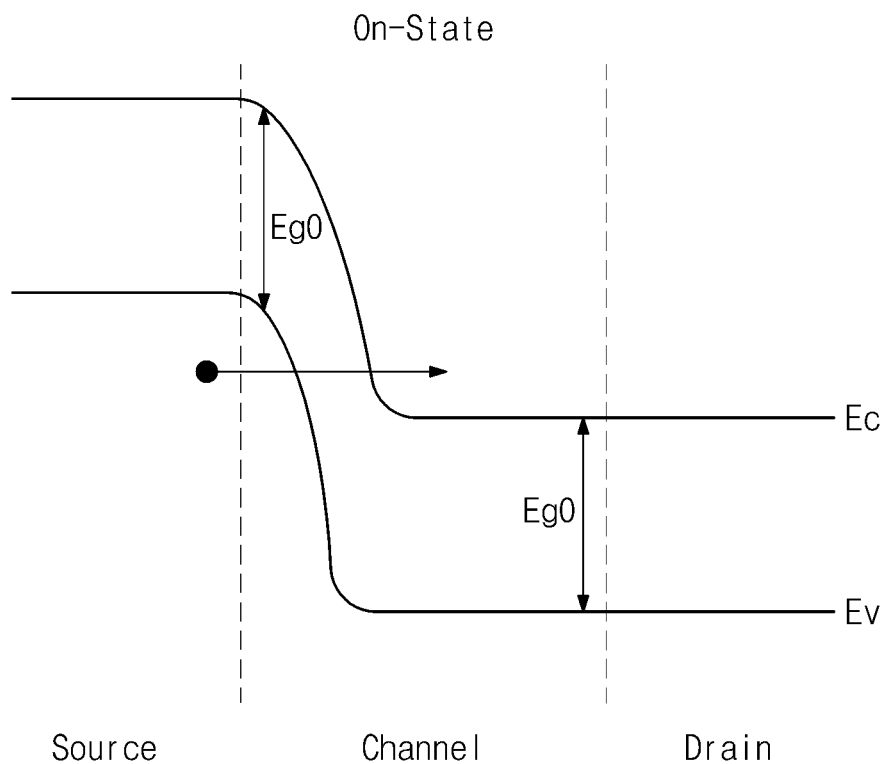
Figure 11C:
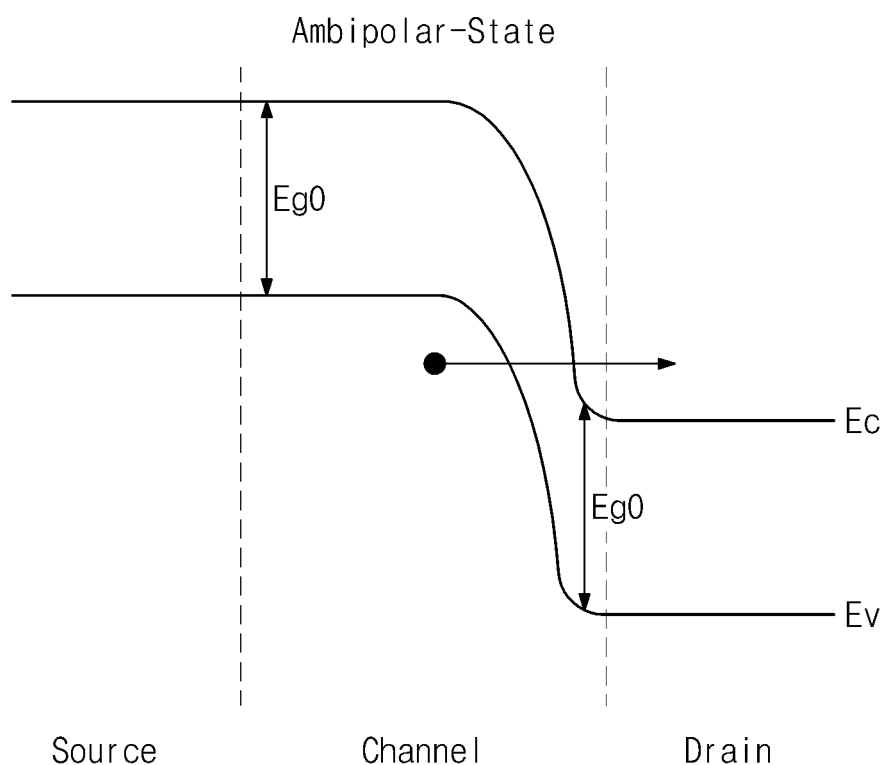

FIGS. 11A, 11B, and 11C are energy band diagrams of a general N-channel tunneling field effect transistor. Unlike a general metal-oxide-semiconductor field effect transistor (MOSFET), a tunneling field effect transistor controls a flow of carriers by a band-to-band tunneling phenomenon, not a thermionic emission phenomenon. For example, if a positive voltage is applied to a gate electrode, the tunneling field effect transistor may be changed from an off-state of FIG. 11A into an on-state of FIG. 11B. As illustrated in FIG. 11B, a carrier may be transferred into a drain by a source-side tunneling phenomenon. This tunneling field effect transistor may have a low sub-threshold swing at room temperature unlike a general MOSFET, and a minimal change of a driving voltage may cause a great change of an output current of the tunneling field effect transistor. However, a general tunneling field effect transistor of which a channel region has a constant energy band gap Eg0 may become in an ambipolar state, as shown in FIG. 11C. The ambipolar state means that a drain-side tunnel phenomenon occurs when a negative voltage is applied to the gate electrode of the general tunneling field effect transistor. As a result, the general tunneling field effect transistor may have a relatively low on-current and a relatively high off-current.

According to some embodiments of the inventive concepts, an energy band gap of a region, which is adjacent to the source region 10, of the channel region 30 may be different from an energy band gap of region, which is adjacent to the drain region 20, of the channel region 30. In some embodiments, the channel region 30 may include a first region R1 adjacent to the source region 10 and a second region R2 adjacent to the drain region 20, and an energy band gap of the first region R1 may be lower than an energy band gap of the second region R2. As such, an energy band gap at one end of the channel region 30 may be different from the energy band gap at the opposite end of the channel region. In some embodiments, the energy band gap of the channel region 30 may become lower from the drain region 20 toward the source region 10 (e.g., in a direction from the second region R2 to the first region R1).

Figure 2A:
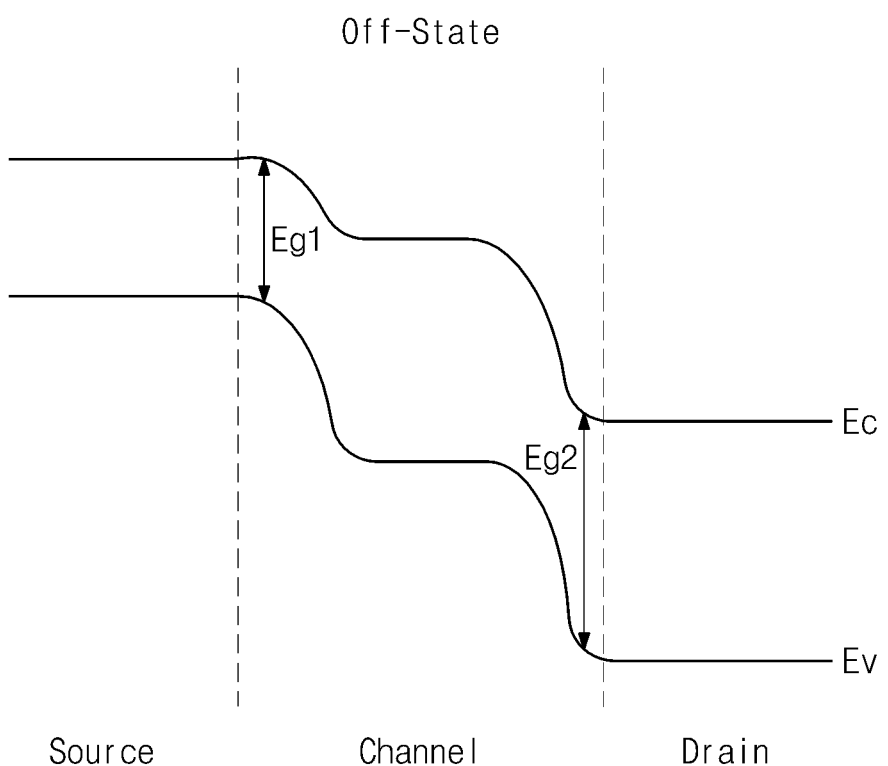
FIGS. 2A and 2B are energy band diagrams when the tunneling field effect transistor of FIG. 1 is an N-type tunneling field effect transistor according to example embodiments.
Figure 2B:
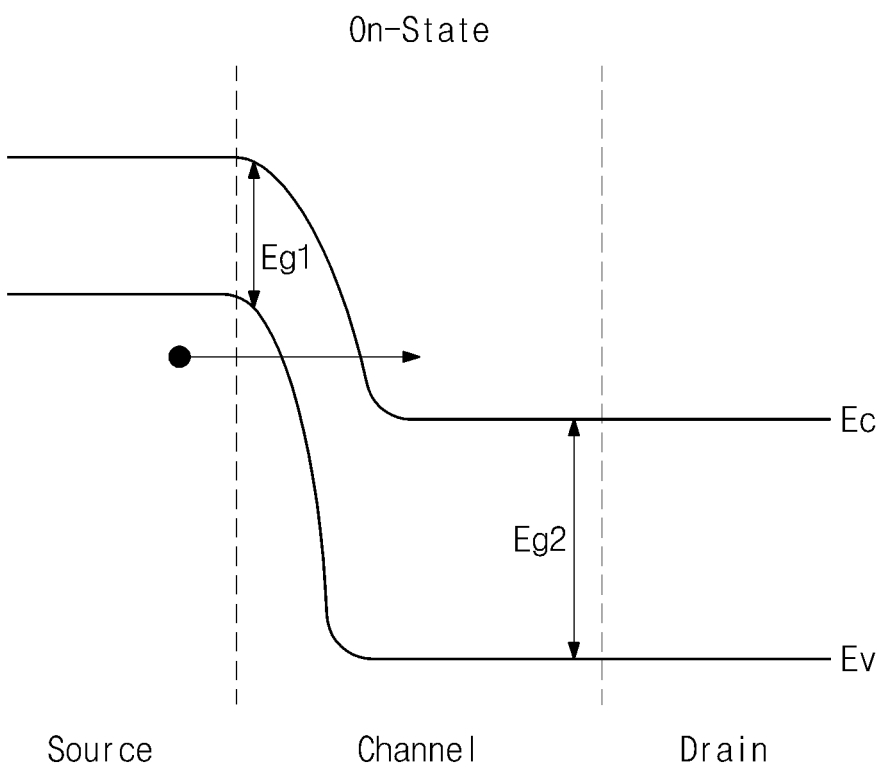
Figure 3A:
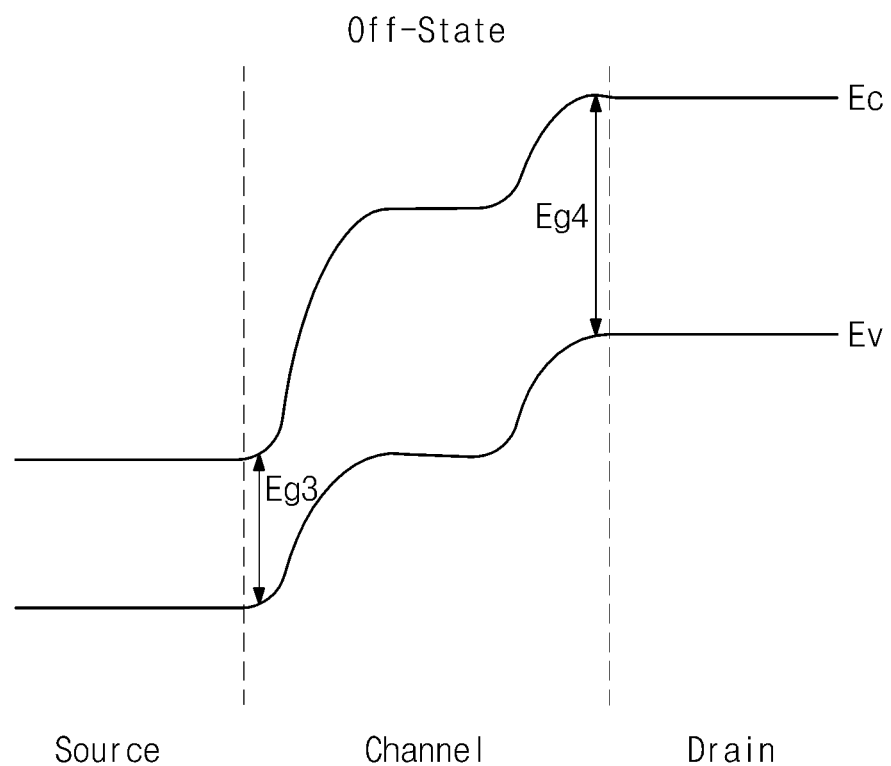
FIGS. 3A and 3B are energy band diagrams when the tunneling field effect transistor of FIG. 1 is a P-type tunneling field effect transistor according to example embodiments.
Figure 3B:
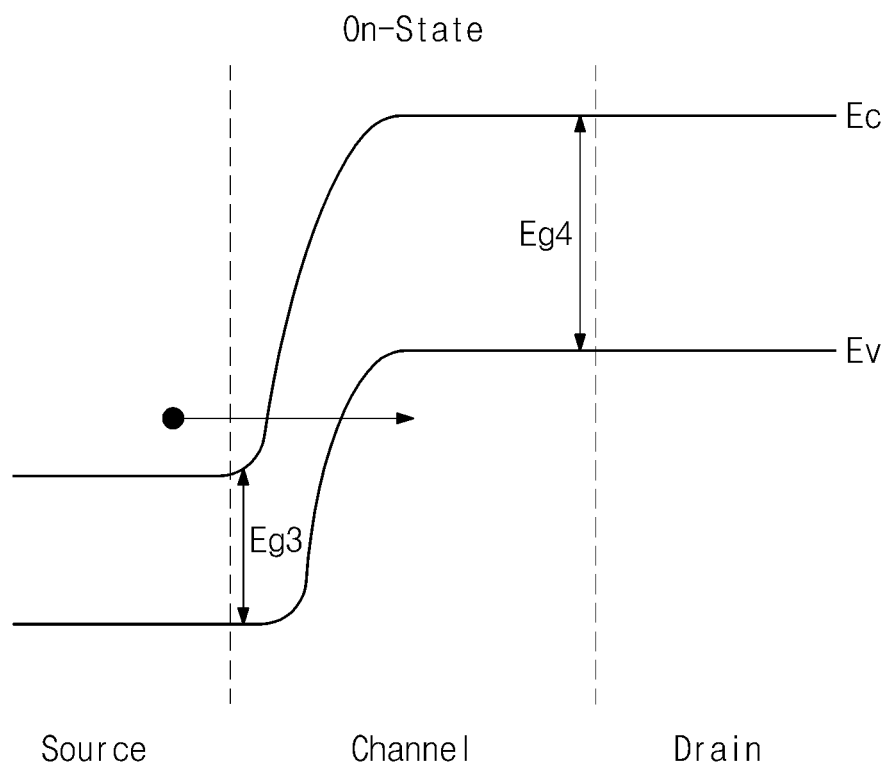

FIGS. 2A and 2B are energy band diagrams when the tunneling field effect transistor of FIG. 1 is an N-type tunneling field effect transistor according to example embodiments. FIGS. 3A and 3B are energy band diagrams when the tunneling field effect transistor of FIG. 1 is a P-type tunneling field effect transistor according to example embodiments.

As illustrated in FIGS. 2A and 2B, if the tunneling field effect transistor according to embodiments of the inventive concepts is an N-type tunneling field effect transistor, an energy band gap Eg1 of the channel region 30 adjacent to the source region 10 may be smaller than an energy band gap Eg2 of the channel region adjacent to the drain region 20. In other embodiments, as illustrated in FIGS. 3A and 3B, if the tunneling field effect transistor according to embodiments of the inventive concepts is a P-type tunneling field effect transistor, an energy band gap Eg3 of the channel region 30 adjacent to the source region 10 may be lower than an energy band gap Eg4 of the channel region adjacent to the drain region 20.

Thus, a source-side tunneling barrier may be lowered by the relatively low energy band gaps Eg1 and Eg3 adjacent to the source region 10 to obtain a high on-current of the tunneling field effect transistor. In addition, a drain-side tunneling barrier may be increased by the relatively high energy band gaps Eg2 and Eg4 adjacent to the drain region 20, and thus, the aforementioned ambipolar (i.e., the drain-side tunneling phenomenon) may be minimized or prevented to obtain a low off-current of the tunneling field effect transistor. In certain embodiments, this asymmetrical energy band gap of the tunneling field effect transistor may be controlled by a composition ratio and/or stress of a semiconductor material included in the channel region 30.

In the tunneling field effect transistor according to some embodiments of the inventive concepts, the channel region 30 adjacent to the source region 10 (e.g., the first region R1) may have a direct energy band gap. If a semiconductor material adjacent to the source region 10, at which the tunneling occurs, has the direct energy band gap, the probability of band-to-band tunneling may be markedly increased to increase the on-current of the tunneling field effect transistor.

In some embodiments, a tunneling field effect transistor may be formed of group IV semiconductor materials. For example, each of the drain region 20, the source region 10, and the channel region 30 may include at least one of the following compounds, silicon-germanium (SiGe), silicon-germanium-tin (SiGeSn), germanium-tin (GeSn), silicon (Si), geranium-lead (GePb), or germanium (Ge).

In one embodiment, the drain region 20 may include germanium (Ge) or silicon-germanium (SiGe), the source region 10 may include geranium-tin (GeSn), and the channel region 30 may include GeSn or silicon-germanium-tin (SiGeSn). For example, a tin (Sn) concentration of the channel region 30 may become higher from the drain region 20 toward the source region 10. For example, the tin (Sn) concentration of the second region R2 may be lower than the tin (Sn) concentration of the first region R1. In one embodiment, the tin (Sn) concentration of the second region R2 may be, for example, about 1% or less, and the tin (Sn) concentration of the first region R1 may be, for example, about 11% or more. The tin (Sn) concentration of the channel region 30 may become higher progressively or stepwise from the second region R2 toward the first region R1. The first region R1 may have a relatively low energy band gap by its high tin (Sn) concentration, and the second region R2 may have a relatively high energy band gap by its low tin (Sn) concentration. If the tin (Sn) concentration of the channel region 30 becomes progressively higher from the second region R2 toward the first region R1, the energy band gap of the channel region 30 may become progressively lower from the second region R2 toward the first region R1. If the tin (Sn) concentration of the channel region 30 becomes higher stepwise from the second region R2 toward the first region R1, the energy band gap of the channel region 30 may become lower stepwise from the second region R2 toward the first region R1. In some embodiments, the channel region 30 may include a plurality of channel layers having different tin (Sn) concentrations from each other, so the channel region 30 may have a plurality of energy band gaps.

In another embodiment, the drain region 20 may include germanium (Ge) or silicon-germanium (SiGe), the source region 10 may include geranium-lead (GePb), and the channel region 30 may include GePb or silicon-germanium-tin (SiGePb). For example, a lead (Pb) concentration of the channel region 30 may become higher from the drain region 20 toward the source region 10. For example, the lead (Pb) concentration of the second region R2 may be lower than the lead (Pb) concentration of the first region R1. In one embodiment, the lead (Pb) concentration of the second region R2 may be, for example, about 1% or less, and the lead (Pb) concentration of the first region R1 may be, for example, about 11% or more. The lead (Pb) concentration of the channel region 30 may become higher progressively or stepwise from the second region R2 toward the first region R1. The first region R1 may have a relatively low energy band gap by its high lead (Pb) concentration, and the second region R2 may have a relatively high energy band gap by its low lead (Pb) concentration. If the lead (Pb) concentration of the channel region 30 becomes progressively higher from the second region R2 toward the first region R1, the energy band gap of the channel region 30 may become progressively lower from the second region R2 toward the first region R1. If the lead (Pb) concentration of the channel region 30 becomes higher stepwise from the second region R2 toward the first region R1, the energy band gap of the channel region 30 may become lower stepwise from the second region R2 toward the first region R1. In some embodiments, the channel region 30 may include a plurality of channel layers having different lead (Pb) concentrations from each other, so the channel region 30 may have a plurality of energy band gaps.

If the tunneling field effect transistor according to some embodiments of the inventive concepts is formed of group IV semiconductor materials, the first region R1 may have the direct energy band gap, and the second region R2 may have an indirect energy band gap. If the tin (Sn) concentration of the first region R1 is, for example, about 11% or more, the first region R1 may have the direct energy band gap even though the first region R1 includes one or more group IV semiconductor materials. On the other hand, the second region R2 having the relatively low tin (Sn) concentration (e.g., about 1% or less) may have the indirect energy band gap. This energy band gap difference (e.g., Eg1<Eg2, or Eg3<Eg4) may increase the on-current of the tunneling field effect transistor and may reduce the off-current of the tunneling field effect transistor. For example, the first region R1 may have the direct energy band gap having the relatively high band-to-band tunneling probability to increase the on-current, and the second region R2 may have the indirect energy band gap having a relatively low band-to-band tunneling probability to reduce the off-current. Some examples of direct and indirect energy band gaps are described in Journal of Applied Physics 113, 194507 (2013), entitled Germanium-tin n-channel tunneling field-effect transistor: Device physics and simulation study to Yue Yang et al, of which is incorporated by reference herein in its entirety.

According to other embodiments of the inventive concepts, a tunneling field effect transistor may be formed of group III-V semiconductor materials. For example, each of the drain region 20, the source region 10, and the channel region 30 may include at least one of the following compounds, indium-gallium-arsenic (InGaAs), indium-gallium-antimony (InGaSb), gallium-antimony (GaSb), indium-arsenic (InAs), gallium-arsenic-antimony (GaAsSb), indium-antimony (InSb), indium-aluminum-antimony (InAlSb), or indium-aluminum-arsenic (InAlAs).

The concentration of at least one element in the channel region may change between one end of the channel region and the opposite end of the channel region. In some embodiments, for example, the drain region 20 may include indium-gallium-arsenic (InGaAs), the source region 10 may include indium-arsenic (InAs), and the channel region 30 may include InGaAs. In this case, a gallium (Ga) concentration of the channel region 30 may become lower progressively or stepwise from the second region R2 toward the first region R1. Thus, the energy band gap of the channel region 30 may become lower progressively or stepwise from the second region R2 toward the first region R1.

In other embodiments, the drain region 20 may include gallium-antimony (GaSb), the source region 10 may include indium-gallium-antimony (InGaSb), and the channel region 30 may include InGaSb. In this case, an indium (In) concentration of the channel region 30 may become higher progressively or stepwise from the second region R2 toward the first region R1. Thus, the energy band gap of the channel region 30 may become lower progressively or stepwise from the second region R2 toward the first region R1. In the event that the source region 10, the channel region 30, and the drain region 20 include the group III-V semiconductor materials, the first region R1 may have the direct energy band gap and the second region R2 may also have a direct energy band gap. Thus, based on an intrinsic material included in the channel region 30 (e.g., having varied concentration of elements within the channel region 30), an energy band gap in different portions of the channel region 30 may vary. The intrinsic material may be the same compound (e.g., having the same set of elements) throughout the channel region 30, having different concentrations of certain elements at different locations within the channel region 30.

Figure 4:
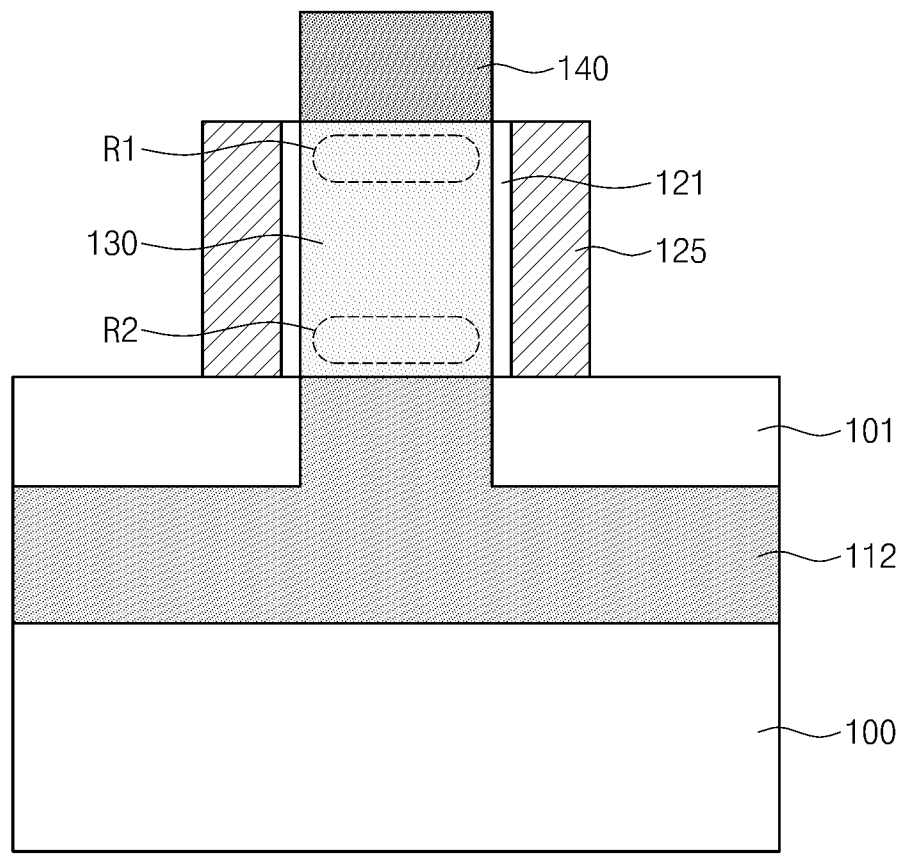
FIG. 4 is a cross-sectional view illustrating a vertical tunneling field effect transistor according to some example embodiments of the inventive concepts.

FIG. 4 is a cross-sectional view illustrating a vertical tunneling field effect transistor according to some example embodiments of the inventive concepts.

Referring to FIG. 4, a tunneling field effect transistor according to the present embodiment may include a drain region 112, a channel region 130, and a source region 140 which are sequentially stacked on a substrate 100. The drain region 112 and the source region 140 may be spaced apart from each other in a direction substantially perpendicular to a top surface of the substrate 100. The substrate 100 may be, for example, a silicon substrate or a substrate including silicon. The drain region 112 may include a protrusion extending upward from the substrate 100 and a recess region disposed at both sides of the protrusion. A device isolation layer 101 may be provided in the recess region. The device isolation layer 101 may include, for example, a silicon oxide layer.

A gate dielectric layer 121 and a gate electrode 125 may be sequentially provided on a sidewall of the channel region 130. Bottom surfaces of the gate dielectric layer 121 and the gate electrode 125 may be in contact with the device isolation layer 101. The gate dielectric layer 121 may include a high-k dielectric material having a dielectric constant higher than that of a silicon oxide layer. For example, the gate dielectric layer 121 may include $HfO_2$, $ZrO_2$, or $Ta_2O_5$. The gate electrode 125 may include, for example, a conductive metal nitride (e.g., TiN, TaN, or WN) and/or a metal (e.g., Ti, Ta, or W).

The drain region 112 and the source region 140 may have different conductivity types from each other. In some embodiments, if the tunneling field effect transistor is an N-type tunneling field effect transistor, the drain region 112 may be an N-type dopant region and the source region 140 may be a P-type dopant region. In other embodiments, if the tunneling field effect transistor is a P-type tunneling field effect transistor, the drain region 112 may be a P-type dopant region and the source region 140 may be an N-type dopant region. For example, the channel region 130 may be an intrinsic region (e.g., including only the intrinsic material without any dopant). Alternatively, the channel region 130 may be a P-type or N-type dopant region (e.g., including the intrinsic material and dopant) that is more lightly doped than the drain region 112 and the source region 140.

In some embodiments, each of the drain region 112, the source region 140, and the channel region 130 may include group III-V semiconductor materials. For example, each of the drain region 112, the source region 140, and the channel region 130 may include at least one of indium-gallium-arsenic (InGaAs), indium-gallium-antimony (InGaSb), gallium-antimony (GaSb), indium-arsenic (InAs), indium-antimony (InSb), indium-aluminum-antimony (InAlSb), indium-aluminum-arsenic (InAlAs), or gallium-arsenic-antimony (GaAsSb).

In other embodiments, each of the drain region 112, the source region 140, and the channel region 130 may include one or more group IV semiconductor materials. For example, the drain region 112, the source region 140, and the channel region 130 may include at least one of germanium-tin (GeSn), silicon-germanium (SiGe), geranium (Ge), silicon (Si), silicon-germanium-tin (SiGeSn), or geranium-lead (GePb). Hereinafter, the tunneling field effect transistor according to materials of the drain region 112, the source region 140 and the channel region 130 will be described in more detail.

In some embodiments, if a channel region of the tunneling field effect transistor is formed of the one or more group IV semiconductor materials (e.g., one or more group IV elements), a portion of the channel region 130 adjacent to the source region 140 may have a direct energy band gap. In this case, another portion of the channel region 130 adjacent to the drain region 112 may have an indirect energy band gap. In addition, an energy band gap of the channel region 130 adjacent to the source region 140 may be lower than an energy band gap of the channel region 130 adjacent to the drain region 112.

In one embodiment, the drain region 112 may include germanium (Ge) or silicon-germanium (SiGe), the source region 140 may include geranium-tin (GeSn), and the channel region 130 may include GeSn or silicon-germanium-tin (SiGeSn). For example, a tin (Sn) concentration of the channel region 130 may become higher from the drain region 112 toward the source region 140. For example, in the event that the channel region 130 includes a first region R1 adjacent to the source region 140 and a second region R2 adjacent to the drain region 112, the tin (Sn) concentration of the second region R2 may be lower than the tin (Sn) concentration of the first region R1. For example, the tin (Sn) concentration of the second region R2 may be, for example, about 1% or less, and the tin (Sn) concentration of the first region R1 may be, for example, about 11% or more. The tin (Sn) concentration of the channel region 130 may become higher progressively or stepwise from the second region R2 toward the first region R1. The first region R1 may have a relatively low energy band gap by its high tin (Sn) concentration, and the second region R2 may have a relatively high energy band gap by its low tin (Sn) concentration. If the tin (Sn) concentration of the channel region 130 becomes progressively higher from the second region R2 toward the first region R1, the energy band gap of the channel region 130 may become progressively lower from the second region R2 toward the first region R1. If the tin (Sn) concentration of the channel region 130 becomes higher stepwise from the second region R2 toward the first region R1, the energy band gap of the channel region 130 may become lower stepwise from the second region R2 toward the first region R1. In some embodiments, the channel region 130 may include a plurality of channel layers having different tin (Sn) concentrations from each other, so the channel region 130 may have a plurality of energy band gaps.

This asymmetrical energy band gap of the channel region 130 may lower a tunneling barrier of the first region R1 to increase an on-current of the tunneling field effect transistor and may increase a tunneling barrier of the second region R2 to reduce an off-current of the tunneling field effect transistor.

If the tin (Sn) concentration of the first region R1 is, for example, about 11% or more, the first region R1 may have the direct energy band gap even though the first region R1 includes one or more group IV semiconductor materials. On the other hand, the second region R2 having the relatively low tin (Sn) concentration (e.g., 1% or less) may have the indirect energy band gap. This energy band gap difference may increase the on-current of the tunneling field effect transistor and may reduce the off-current of the tunneling field effect transistor. For example, the first region R1 may have the direct energy band gap having the relatively high band-to-band tunneling probability to increase the on-current, and the second region R2 may have the indirect energy band gap having a relatively low band-to-band tunneling probability to reduce the off-current.

In some embodiments, if the tunneling field effect transistor according to some embodiments is formed of the group III-V semiconductor materials, an energy band gap of the channel region 130 adjacent to the source region 140 may be lower than an energy band gap of the channel region 130 adjacent to the drain region 112.

In one embodiment, the drain region 112 may include InGaAs, the source region 140 may include InAs, and the channel region 130 may include InGaAs (e.g., intrinsic materials). For example, a gallium (Ga) concentration of the channel region 130 may become lower progressively or stepwise from the second region R2 toward the first region R1, and thus, the energy band gap of the channel region 130 may become lower progressively or stepwise from the second region R2 toward the first region R1.

In other embodiment, the drain region 112 may include GaSb, the source region 140 may include InGaSb, and the channel region 130 may include InGaSb. For example, an indium (In) concentration of the channel region 130 may become higher progressively or stepwise from the second region R2 toward the first region R1, and thus, the energy band gap of the channel region 130 may become lower progressively or stepwise from the second region R2 toward the first region R1.

This asymmetrical energy band gap of the channel region 130 may lower the tunneling barrier of the first region R1 to increase the on-current of the tunneling field effect transistor and may increase the tunneling barrier of the second region R2 to reduce the off-current of the tunneling field effect transistor.

FIGS. 5 to 9 are cross-sectional views illustrating a method of manufacturing a vertical tunneling field effect transistor according to example embodiments of the inventive concepts.

Figure 5:
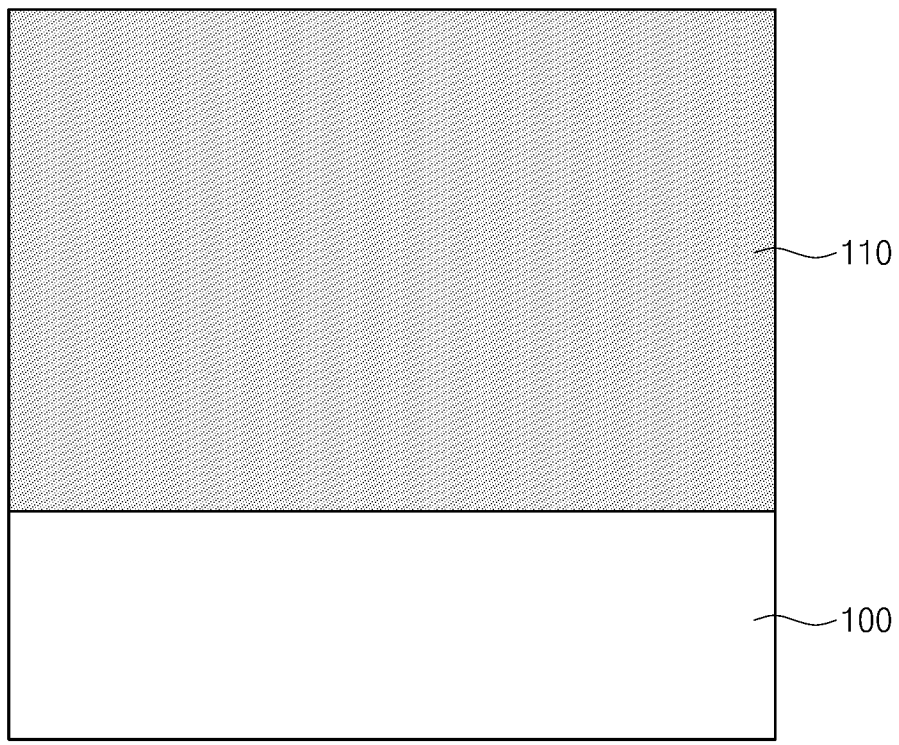
FIGS. 5 to 9 are cross-sectional views illustrating a method of manufacturing a vertical tunneling field effect transistor according to example embodiments of the inventive concepts.

Referring to FIG. 5, a semiconductor layer 110 may be formed on a substrate 100. The substrate 100 may be, for example, a silicon substrate or a substrate including silicon. The semiconductor layer 110 may be formed by performing an epitaxial growth process on the substrate 100. In some embodiments, the epitaxial growth process may be a chemical vapor deposition (CVD) process or a molecular beam epitaxy (MBE) process. If a tunneling field effect transistor according to some embodiments is an N-type tunneling field effect transistor, the semiconductor layer 110 may be doped with N-type dopants (e.g., Si). Alternatively, if the tunneling field effect transistor according to some embodiments is a P-type tunneling field effect transistor, the semiconductor layer 110 may be doped with P-type dopants (e.g., Zn). In some embodiments, the semiconductor layer 110 may be doped in-situ or may be doped by an additional ion implantation process performed after the epitaxial growth process. In some embodiments, a dopant concentration of the semiconductor layer 110 may be in a range of, for example, about $1 \times 10^{19}$ atm/cm$^3$ to about $1 \times 10^{21}$ atm/cm$^3$. The semiconductor layer 110 may include the same material as that of the drain region 112 described with reference to FIG. 4.

Figure 6:
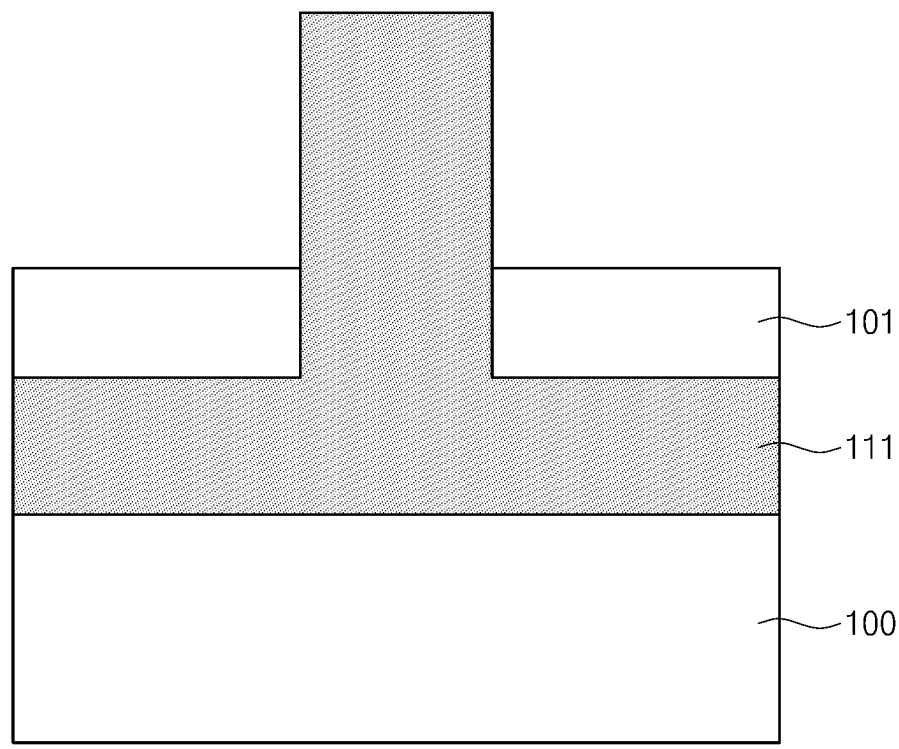

Referring to FIG. 6, the semiconductor layer 110 may be patterned to form a recess region, and a device isolation layer 101 may be then formed to fill the recess region. As a result, a semiconductor pattern 111 may be formed. The patterning process of the semiconductor layer 110 may include a process of forming a mask pattern on the semiconductor layer 110 and a dry etching process using the mask pattern (not shown). The device isolation layer 101 may be formed of, for example, silicon oxide. The device isolation layer 101 may be formed by a CVD process. The device isolation layer 101 may be recessed to have a top surface lower than a topmost surface of the semiconductor pattern 111. Thus, the semiconductor pattern 111 may have a portion protruding from the device isolation pattern 101.

Figure 7:
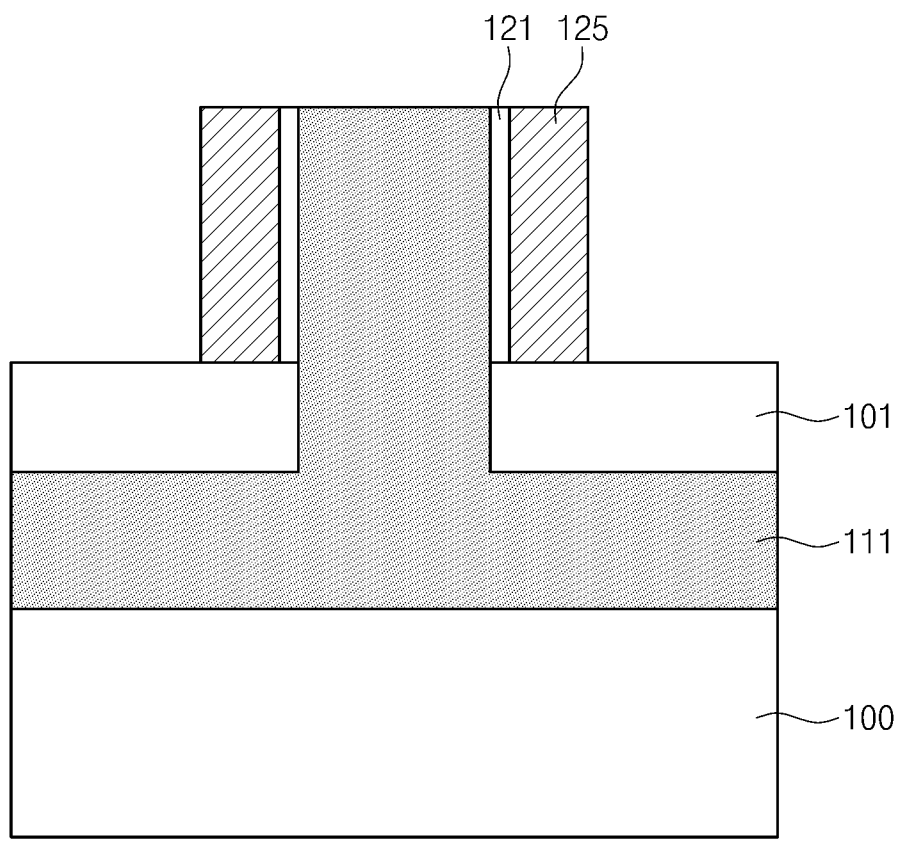

Referring to FIG. 7, a gate dielectric layer 121 and a gate electrode 125 may be sequentially formed on a sidewall of the protruding portion of the semiconductor pattern 111. The gate dielectric layer 121 and the gate electrode 125 may expose a top surface of the protruding portion of the semiconductor pattern 111. The gate dielectric layer 121 may be formed of a high-k dielectric material having a dielectric constant higher than that of a silicon oxide layer. For example, the gate dielectric layer 121 may include $HfO_2$, $ZrO_2$, or $Ta_2O_5$. The gate electrode 125 may include a conductive material, for example, a conductive metal nitride (e.g., TiN, TaN, or WN) and/or a metal (e.g., Ti, Ta, or W). A dielectric layer may be formed to cover the semiconductor pattern 111, and a dry etching process may be then performed on the dielectric layer to form the gate dielectric layer 121. A conductive layer may be formed on the gate dielectric layer 121, and a dry etching process may be then performed on the conductive layer to form the gate electrode 125. In other embodiments, after a dielectric layer and a conductive layer may be sequentially formed to cover the semiconductor pattern 111, a planarization process and a patterning process may be performed to form the gate dielectric layer 121 and the gate electrode 125.

Figure 8:
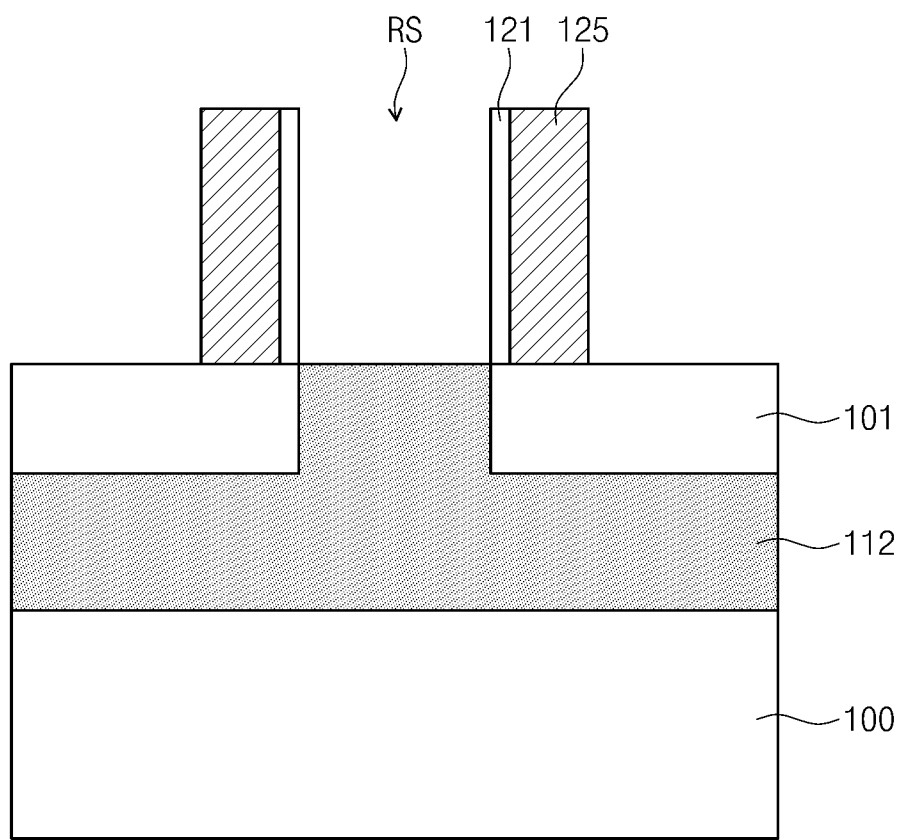

Referring to FIG. 8, the protruding portion of the semiconductor pattern 111 may be selectively removed to form a drain region 112. For example, a top surface of the drain region 112 may be disposed at a substantially same level as a top surface of the device isolation layer 101, as illustrated in FIG. 8, however, the inventive concepts are not limited thereto. A recess region RS may be formed by the selective removing process. The recess region RS may be defined by the top surface of the drain region 112 and a sidewall of the gate dielectric layer 121.

Figure 9:
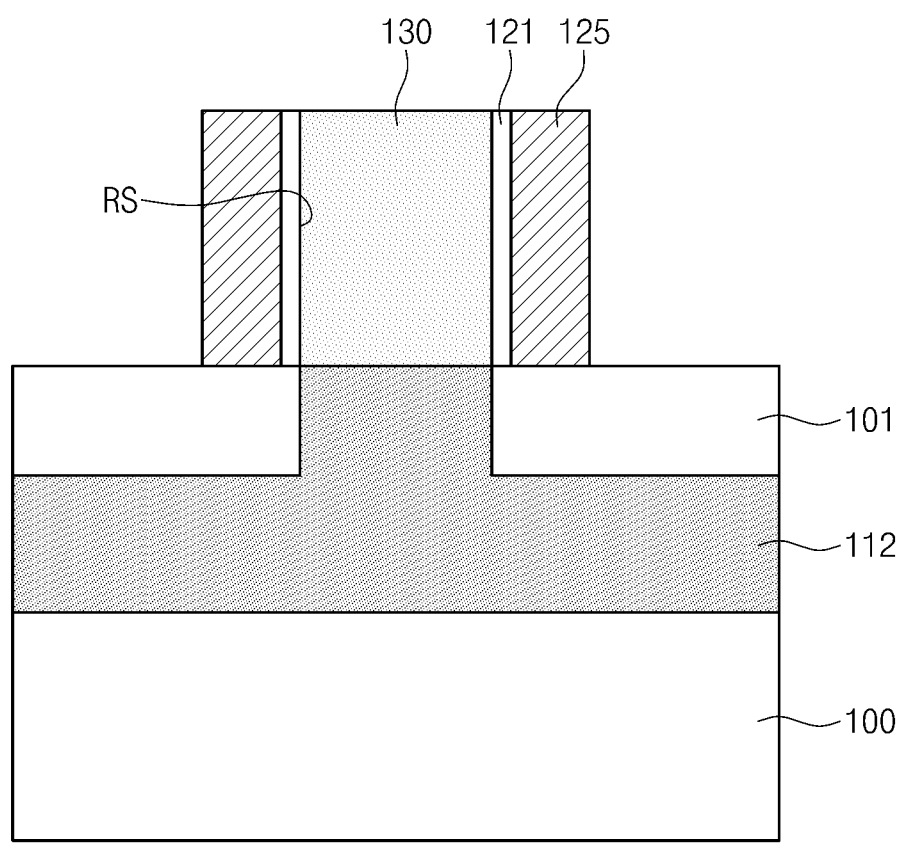

Referring to FIG. 9, a channel region 130 may be formed to fill the recess region RS. The channel region 130 may be formed by an epitaxial process using a top surface of the drain region 112 exposed by the recess region RS as a seed. The channel region 130 may be an intrinsic semiconductor region (e.g., including only an intrinsic material without any dopant). In other embodiments, the channel region 130 may be a P-type or N-type dopant region (e.g., including the intrinsic material and dopant) which is more lightly doped than the drain region 112.

An upper portion and a lower portion of the channel region 130 may have different composition ratios from each other. In some embodiments, if the channel region 130 includes InGaAs, a gallium (Ga) concentration of the lower portion of the channel region 130 may be higher than a gallium concentration of the upper portion of the channel region 130. In other embodiments, if the channel region 130 includes InGaSb, an indium (In) concentration of the lower portion of the channel region 130 may be lower than an indium concentration of the upper portion of the channel region 130. In still other embodiments, if the channel region 130 includes GeSn or SiGeSn, a tin (Sn) concentration of the upper portion of the channel region 130 may be higher than a tin (Sn) concentration of the lower portion of the channel region 130. For example, the tin (Sn) concentration of the upper portion of the channel region 130 may be, for example, about 11% or more. The different composition ratios of the upper and lower portions of the channel region 130 may be realized by controlling the amounts of sources of the epitaxial process.

Referring again to FIG. 4, a source region 140 may be formed on the channel region 130. The source region 140 may be formed by an epitaxial process using a top surface of the channel region 130 as a seed. If the tunneling field effect transistor according to some embodiments of the inventive concepts is the N-type tunneling field effect transistor, the source region 140 may be doped with P-type dopants. Alternatively, if the tunneling field effect transistor according to some embodiments of the inventive concepts is the P-type tunneling field effect transistor, the source region 140 may be doped with N-type dopants. In some embodiments, the source region 140 may be doped in-situ or may be doped by an additional ion implantation process performed after the epitaxial process. In some embodiments, a dopant concentration of the source region 140 may be in a range of, for example, about $1 \times 10^{19}$ atm/cm$^3$ to about $1 \times 10^{21}$ atm/cm$^3$.

Figure 10:
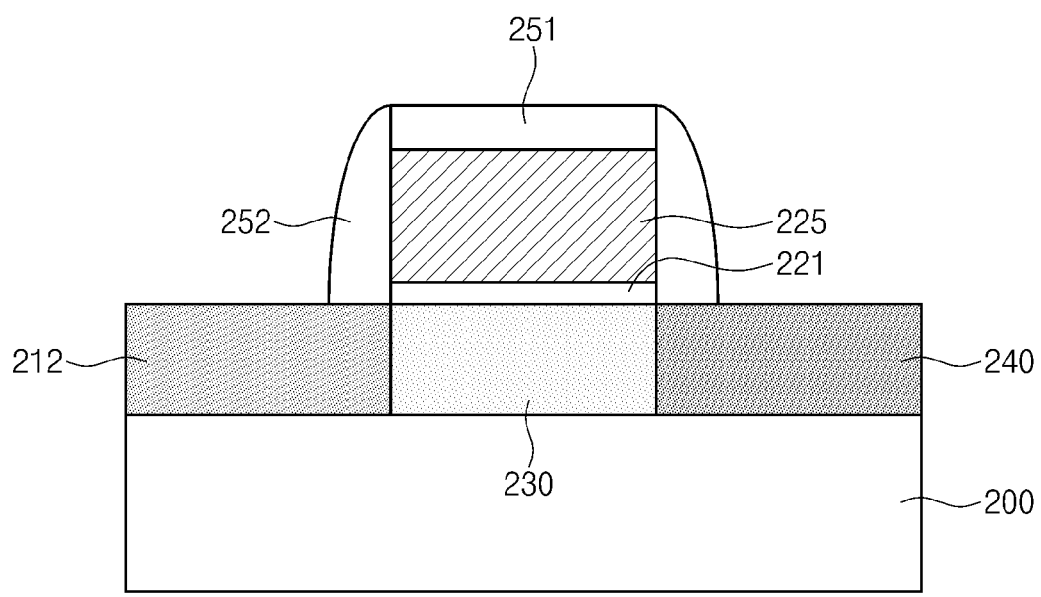
FIG. 10 is a cross-sectional view illustrating a horizontal tunneling field effect transistor according to other example embodiments of the inventive concepts.

FIG. 10 is a cross-sectional view illustrating a horizontal tunneling field effect transistor according to other example embodiments of the inventive concepts. In the present embodiment, the same descriptions as described in the aforementioned embodiment will be omitted or mentioned briefly for the purpose of ease and convenience in explanation.

Referring to FIG. 10, a drain region 212, a channel region 230, and a source region 240 may be provided on a substrate 200. The channel region 230 may be provided between the drain region 212 and the source region 240. The drain region 212, the channel region 230, and the source region 240 may be disposed at a substantially same level on the substrate 200. The drain region 212, the channel region 230, and the source region 240 may have the same materials, the same conductivity types and the same characteristics as the drain region 112, the channel region 130, and the source region 140 described with reference to FIG. 4. The drain region 212, the channel region 230, and the source region 240 may be formed by different epitaxial processes from and different removing processes from each other.

A gate dielectric layer 221 and a gate electrode 225 may be sequentially stacked on the channel region 230. A spacer 252 may be provided on a sidewall of the gate electrode 225, and a capping layer 251 may be provided on a top surface of the gate electrode 225.

A tunneling field effect transistor according to above disclosed embodiments may be included in a semiconductor device. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias (TSVs), or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Figure 12:
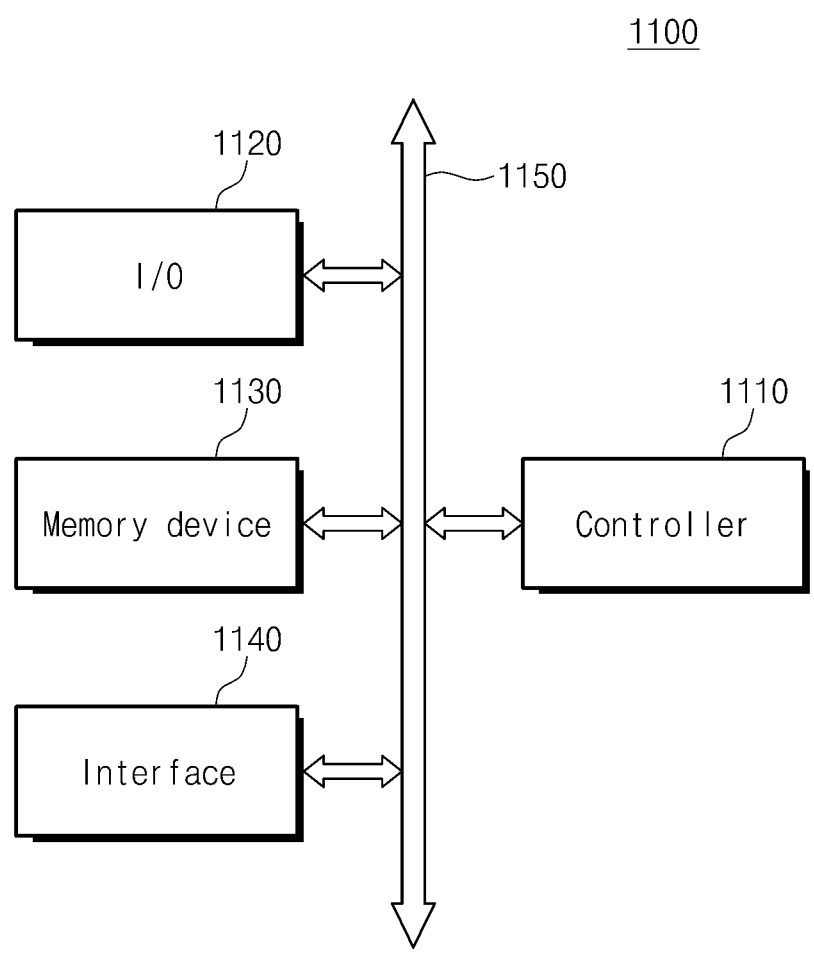
FIG. 12 is a schematic block diagram illustrating an electronic system including a semiconductor device according to certain embodiments of the inventive concepts.

FIG. 12 is a schematic block diagram illustrating an electronic system including a semiconductor device according to certain embodiments of the inventive concepts.

Referring to FIG. 12, an electronic system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include, for example, a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a wireless/cable transceiver. Although not shown in the drawings, the electronic system 1100 may further include a fast dynamic random access memory (Fast-DRAM) device and/or a fast static random access memory (Fast-SRAM) device which acts as a working memory for improving an operation of the controller 1110. At least one of the semiconductor devices according to embodiments of the inventive concepts may be provided into the memory device 1130 or may be used as the controller 1110 and/or a portion of the I/O unit 1120.

The electronic system 1100 may be applied to a personal digital assistant (PDA), a portable computer, a web tablet, a wireless phone, a mobile phone, a digital music player, a memory card, or other electronic products. The other electronic products may receive or transmit information data by wireless transmission.

Figure 13:
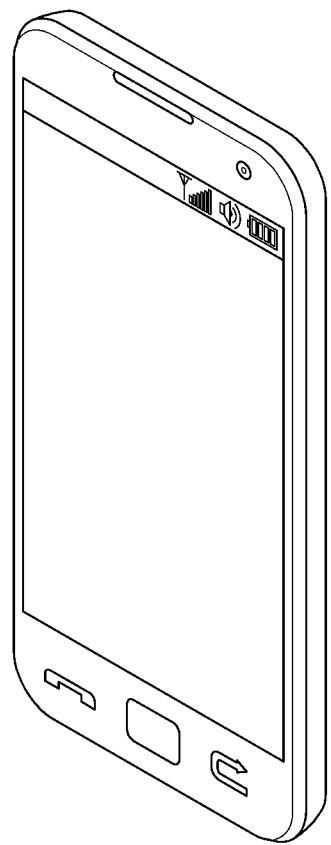
FIG. 13 illustrates an example of a mobile phone applied with the electronic system of FIG. 12.

The electronic system 1100 of FIG. 12 may be used as one of electronic control devices of various electronic devices. FIG. 13 illustrates an example of a mobile phone 800 applied with the electronic system 1100 of FIG. 12. In other embodiments, the electronic system 1100 of FIG. 12 may be applied to a portable notebook, a MP3 player, a navigation device, a solid state disk (SSD), cars, or household appliances.

According to embodiments of the inventive concepts, the tunneling field effect transistor having the high on-current and the low off-current may be realized by the asymmetrical energy band gap of its channel region. In addition, the channel region adjacent to the source region may have the direct energy band gap, and thus, the on-current may be further increased and the off-current may be further reduced.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A tunneling field effect transistor comprising:
a source region including a first material;
a drain region including a second material; and a channel region including a third material, and disposed between the source region and the drain region,
wherein the channel region comprises a first region adjacent to the source region, and a second region adjacent to the drain region,
wherein a first energy band gap of the first region is lower than a second energy band gap of the second region,
wherein the first region has a direct energy band gap, and
wherein each of the first, the second, and the third materials includes one or more group III-V semiconductor materials.

2. The tunneling field effect transistor of claim 1, wherein an energy band gap of the channel region becomes lower progressively or stepwise from the second region toward the first region.

3. The tunneling field effect transistor of claim 1, wherein the second region has a direct energy band gap.

4. The tunneling field effect transistor of claim 1, wherein the third material includes at least one of indium-gallium-arsenic (InGaAs), indium-gallium-antimony (InGaSb), gallium-antimony (GaSb), indium-arsenic (InAs), or gallium-arsenic-antimony (GaAsSb).

5. The tunneling field effect transistor of claim 1, wherein the third material includes indium-gallium-arsenic (InGaAs), or indium-gallium-antimony (InGaSb), and:
when the third material includes InGaAs, a gallium (Ga) concentration of the channel region becomes lower from the second region toward the first region, and
when the third material includes InGaSb, an indium (In) concentration of the channel region becomes higher from the second region toward the first region.

6. The tunneling field effect transistor of claim 1, wherein the source region, the drain region, and the channel region are stacked either vertically or horizontally in sequence on a substrate.

7. A tunneling field effect transistor comprising:
a drain region including a first material, a channel region including a second material, and a source region including a third material,
wherein each of the first, the second, and the third materials includes one or more group IV semiconductor materials including at least germanium (Ge),
wherein the drain region, the channel region, and the source region are sequentially stacked either vertically or horizontally on a substrate,
wherein an energy band gap of the channel region resulting from the second material becomes lower from the drain region toward the source region,
wherein a first portion of the channel region adjacent to the source region has a direct energy band gap, and
wherein a second portion of the channel region adjacent to the drain region has an indirect energy band gap.

8. The tunneling field effect transistor of claim 7, wherein the second material includes germanium-tin (GeSn), and
wherein a tin (Sn) concentration of the first portion is higher than a tin (Sn) concentration of the second portion.

9. The tunneling field effect transistor of claim 8, wherein the (Sn) concentration of the first portion is equal to or greater than 11%.

10. The tunneling field effect transistor of claim 7, wherein the energy band gap of the channel region becomes progressively lower from the drain region toward the source region.

11. The tunneling field effect transistor of claim 7, wherein the second material includes at least one of germanium-tin (GeSn), silicon-germanium (SiGe), or geranium-lead (GePb).

12. The tunneling field effect transistor of claim 7, wherein the second material includes germanium-tin (GeSn) or silicon-germanium-tin (SiGeSn), and
wherein a tin (Sn) concentration of the first region is higher than a tin (Sn) concentration of the second region.

13. The tunneling field effect transistor of claim 12, wherein the tin (Sn) concentration of the first region is equal to or greater than 11%.

14. The tunneling field effect transistor of claim 7, wherein the second region has an indirect energy band gap.

15. A tunneling field effect transistor comprising:
a drain region, a channel region, and a source region sequentially stacked on a substrate, the drain region, the channel region, and the source region being sequentially stacked in a direction either perpendicular to a surface of the substrate, or parallel to the surface of the substrate,
wherein the channel region includes an material that includes group III-V semiconductor materials, and
wherein the concentration of at least one group III-V element from the material becomes higher from one end of the channel region to an opposite end of the channel region.

16. The tunneling field effect transistor of claim 15, wherein the material includes indium-gallium-arsenic (InGaAs) or indium-gallium-antimony (InGaSb), and:
when the material includes InGaAs, a gallium (Ga) concentration of the channel region becomes lower from a second portion adjacent to the drain region to a first portion adjacent to the source region, and
when the material includes InGaSb, an indium (In) concentration of the channel region becomes higher from a second portion adjacent to the drain region to a first portion adjacent to the source region.

17. The tunneling field effect transistor of claim 15, wherein the channel region includes a first portion adjacent to the source region, and a second portion adjacent to the drain region, and
wherein a first energy band gap of the first portion is lower than a second energy band gap of the second portion.

18. The tunneling field effect transistor of claim 15, wherein the channel region includes a first portion adjacent to the source region, and a second portion adjacent to the drain region, and
wherein the first portion has a direct energy band gap.

* * * * *